United States Patent [19]

Ochi et al.

[11] 4,299,911

[45] Nov. 10, 1981

[54] HIGH ENERGY RADIATION CURABLE RESIST MATERIAL AND METHOD OF USING THE SAME

[75] Inventors: Hideo Ochi, Kawasaki; Yumi Shibata; Kohtaro Nagasawa, both of Tokyo, all of Japan

[73] Assignee: Somar Manufacturing Co., Ltd., Tokyo, Japan

[21] Appl. No.: 932,160

[22] Filed: Aug. 9, 1978

[30] Foreign Application Priority Data

Aug. 9, 1977 [JP] Japan .................................. 52/95456
Jun. 12, 1978 [JP] Japan .................................. 53/69808

[51] Int. Cl.$^2$ .......................... B05D 3/06; G03C 1/71
[52] U.S. Cl. ..................................... 430/286; 96/35.1; 96/36.2; 204/159.16; 204/159.22; 430/280; 430/296; 430/313
[58] Field of Search ................. 96/35.1, 36.2; 427/43, 427/44, 54; 260/837 R; 204/159.22, 159.16

[56] References Cited

U.S. PATENT DOCUMENTS

| | | | |
|---|---|---|---|
| 3,418,295 | 12/1968 | Schoenthaler | 96/115 R |
| 3,770,433 | 11/1973 | Bartelt et al. | 96/115 R |
| 3,923,523 | 12/1975 | Nishikubo et al. | 427/44 |
| 3,980,483 | 9/1976 | Nishikubo et al. | 260/837 R |
| 4,049,745 | 9/1977 | Schuster et al. | 260/837 R |

*Primary Examiner*—John H. Newsome
*Attorney, Agent, or Firm*—Sughrue, Mion, Zinn, Macpeak and Seas

[57] ABSTRACT

A resist material curable by irradiation with high energy radiation such as electron beams, X-rays, ion beams, neutron beams, γ-rays or deep ultraviolet light but substantially non-curable by irradiation with light having a wavelength of about 300 nm or more, the resist material comprising, as a main component, a solvent-soluble polymer containing an ethylenically unsaturated double bond, the polymer being obtained by reacting (a) a polymer having a plurality of oxirane rings therein and (b) a monomer containing (i) at least one ethylenically unsaturated double bond and (ii) one functional group capable of opening the oxirane rings, and then opening the unreacted oxirane rings.

32 Claims, No Drawings

HIGH ENERGY RADIATION CURABLE RESIST MATERIAL AND METHOD OF USING THE SAME

BACKGROUND OF THE INVENTION

1. Field of the Invention

This invention relates to a "negative-type" resist material capable of being processed under visible light or normal room illumination, which is curable by irradiation with high energy radiation such as electron beams, X-rays, ion beams, $\beta$-rays, $\gamma$-rays, neutron beams and deep ultraviolet light but is substantially non-curable by irradiation with light having a wavelength of about 300 nm or more. More particularly, the present invention relates to a resist material for microworking of mainly superhigh density integrated circuits and various other devices in the electronics industry.

2. Description of the Prior Art

Two types of resist materials for high energy radiation are known. One type is a so-called positive type resist material in which the irradiated areas decompose and become solvent-soluble, and the other type is a negative type resist material, in which the resist material of this invention operates in a similar manner, in that the irradiated areas are cured and become solvent-insoluble.

Poly(methyl methacrylate) has long been known as a positive type resist material. Poly(methyl methacrylate) has very excellent resolution properties, but the sensitivity thereof is very low, thus, it is very disadvantageous for practical use (e.g., as disclosed in I. Haller et al., *IBM J. Res & Develop.*, 12, 251 (1968)). Further, poly(butene-1 sulfone) has a sufficiently high sensitivity but has inferior resolution properties and is quite poor in anti-ion etching property (e.g., as disclosed in M. J. Bowden et al., *J. Vac. Sci. & Technol.*, 12, 1294 (1975)).

On the other hand, poly(glycidyl methacrylate-CO-ethyl acrylate) is known as a negative type resist material (e.g., as disclosed in L. F. Thompson et al., *Polymer Eng. Sci.*, 14, 529 (1974)). This material has sufficient sensitivity, e.g., as high as $10^{-7}$ coulomb/cm$^2$, but does not have sufficient resolution properties. Namely, this material is not practically applicable for pattern formation of less than 1$\mu$. Further, the heat stability of this resist material is low, and even if prebaking is carried out at 80° C. for 30 minutes using this resist material, heat fog takes place.

In addition, poly(diallyl phthalate) having good heat stability and anti-plasma etching properties is known as a negative type resist material. However, this material has a low sensitivity (e.g., as disclosed in J. L. Bartlett, *Appl. Polymer Symposium*, No. 23, 139 (1974)).

In view of the above, no resist materials are known which are free of problems in all areas of sensitivity, resolution properties, storage stability and heat stability.

Recently, application of lithography using short-wavelength radiation such as electron beams, X-rays and vacuum ultraviolet light has been extensively studied incident to the higher degree of integration of semiconductor integrated circuits or the production of sonic wave elements of an ultrafine structure, magnetic bubble memories, etc.

Radiation-polymerizable and insolubilizable compounds are well known in the art as radiation-curable or negative resist materials.

Typically, a negative resist material is dissolved in a suitable solvent, and the solution is coated on the surface of a substrate. The solvent is evaporated off to form a resist film on the surface. The resist film is then exposed to radiation to cure the resist film in the exposed portion. The unexposed portion is removed with a solvent to form a resist image. The portion of the substrate not covered by the cured film is processed by, for example, etching or impurity doping, and the cured film is removed chemically or by plasma etching.

Some known conventional negative resist materials have sufficiently high sensitivity for practical applications. Generally, however, the resolving power and stability of negative resist materials tend to decrease as their sensitivity increases. Really practical negative resist materials which have satisfactory sensitivity, resolving power and stability are not yet known as can be seen from the above.

Further, many types of resist materials must be employed using several types of methods in order to attain superior adhesion to the surfaces of various substrates, for example, substrates of a non-metal or non-metal compound such as silicon, silicon oxide or silicon nitride, a metal or metal compound such as chromium, aluminum, gold, or chromium oxide, or a rare earth compound or a rare earth element composite, and to obtain superior resistance to etching as well as high sensitivity and high resolution which is desirable. Detailed investigations have now led to a resist material having a high level of practical applicability that can meet these requirements and the present invention has been accomplished.

SUMMARY OF THE INVENTION

Accordingly, the present invention in one embodiment provides a resist material comprising, as a main component, an oxirane ring-free, solvent-soluble polymer having an ethylenically unsaturated bond, the polymer being obtained by reacting (a) a polymer containing a plurality of oxirane rings and (b) a monomer containing (i) at least one ethylenically unsaturated bond and (ii) one functional group capable of opening, and adding to, oxirane rings, and then opening the remaining unreacted oxirane rings in the polymer.

Further, this invention provides in another embodiment a method of forming a resist which comprises irradiating with high energy radiation such as electron beams, X-rays or ion beams an element comprising a substrate having thereon a thin film of the resist material described above, dissolving and removing with a solvent the unexposed, uncured portions of the thin film with the cured, exposed portions of the film remaining, thereby forming a pattern of the cured portions of the resist material film on the surface of the substrate.

DETAILED DESCRIPTION OF THE INVENTION

As set forth above, this invention provides a resist material curable by irradiation with high energy radiation such as electron beams, X-rays, ion beams, $\gamma$-rays, neutron beams and deep ultraviolet light. The term "high energy radiation" as used herein means radiation possessing a high energy capable of curing a resist material as compared with conventionally used ultraviolet light in photolithography (e.g., as described in J. G. Calvert et al., *Photochemistry*, John Wiley & Sons (1967)). Suitable high energy radiation has a wavelength of, i.e., a wavelength of about $3.10^3$ to about $10^{-3}$ Å (or $10^{-3} \leq \lambda < 3.10^3$ Å). A suitable amount of energy of the high energy radiation appropriate to cure the resist material of this invention ranges from about $10^2$ to about $10^7$ K cal/einstein. The threshold value (dosage of radiation) of the amount of energy is in the range of about $10^{-7}$ to about $10^{-6}$ coulomb/cm². In this invention, high energy radiation as defined above is used and the minimum dosage, which, of course, depends on the individual resist material, is used to harden and cure the resist material in the irradiated areas.

The polymer containing an ethylenically unsaturated double bond provided by one embodiment of this invention is described in detail below.

Specific examples of polymers having oxirane rings therein, which is a starting material for the resist material of this invention, are homopolymers obtained by "vinyl polymerization" through an ethylenically unsaturated double bond of a monomer containing an oxirane ring and an ethylenically unsaturated double bond such as glycidyl acrylate, glycidyl methacrylate, 2-vinylthioglycidyl ether, allyl glycidyl ether, glycidyl vinylacetate, glycidyl allylacetate, 4-glycidyl styrene, 2-allylphenyl glycidyl ether, 4-allylphenyl glycidyl ether, glycidyl 4-vinylbenzoate, 3,4-epoxybutene, 3,4-epoxy-2-methylbutene, 4-vinylcyclohexene oxide and p-divinylstyrene monooxide; copolymers obtained by polymerizing two or more of such monomers; and binary or ternary copolymers of a monomer having an oxirane ring and an ethylenically unsaturated double bond as exemplified above with vinyl monomers free from an oxirane ring, for example, styrene and derivatives thereof such as 2-chlorostyrene, 4-chlorostyrene, 2-vinyltoluene and 4-vinyltoluene, alkyl, cycloalkyl, aryl or aralkyl esters of acrylic or methacrylic acid such as methyl acrylate, methyl methacrylate, ethyl acrylate, ethyl methacrylate, n-propyl acrylate, n-propyl methacrylate, isopropyl acrylate, isopropyl methacrylate, tert-butyl acrylate, tert-butyl methacrylate, cyclohexyl acrylate, cyclohexyl methacrylate, benzyl acrylate, benzyl methacrylate, phenyl acrylate and phenyl methacrylate; acrylic or methacrylic acid derivatives such as acrylonitrile, methacrylonitrile, acrylamide and methacrylamide; vinyl halides such as vinyl chloride, vinylidene chloride, vinyl fluoride, and ethylene chlorotrifluoride; vinyl ketones such as methyl vinyl ketone or ethyl vinyl ketone; and vinyl monomers such as vinylacetic acid and allylacetic acid. When the vinyl monomer not containing an oxirane ring has a functional group capable of easily adding to, and opening, oxirane rings, such as a free carboxyl group, or a plurality of ethylenically unsaturated bonds (for example, divinyl sulfone), there is a possibility that a cross-linking reaction either completely or locally will occur. The use of such a monomer should be avoided for the synthesis of the oxirane-containing polymer as a starting material for the resist material of this invention.

The oxirane ring-containing polymer desirably has a number average molecular weight, $\overline{M}n$, of usually about $10^2$ to $10^6$, preferably $5\times10^3$ to $5\times10^5$, for use as a starting material for the resist material of this invention. Further, the oxirane ring-containing polymer utilizable in this invention preferably has a molecular distribution $\overline{M}w/\overline{M}n \leq 5$, more desirably $\overline{M}w/\overline{M}n \leq 3$, where $\overline{M}w$ is the weight average molecular weight and $\overline{M}n$ is the number average molecular weight. The amount of the monomer containing an oxirane ring in the polymer is preferably at least about 10 mol%, more preferably at least 30 mol%.

The oxirane ring-containing polymer can be easily synthesized using known conventional vinyl polymerization methods.

Suitable methods of polymerization which can be used to produce the oxirane ring-containing polymer employed in this invention include conventional radical polymerizations as described in references dealing with polymer syntheses, for instance, B. Vollmert, *Polymer Chemistry*, p. 149, Springer-Verlag, New York (1973) and specific examples include bulk, solution, suspension, and emulsion polymerizations. The most preferred method of the above-described polymerizations is solution polymerization, because of the ease with which the degree of polymerization and the rate of conversion (of monomer(s) to polymer) can be controlled. Furthermore, purification of the polymer formed using solution polymerization can be comparatively effectively executed. Representative examples of radical polymerizations which can be used to produce oxirane ring-containing polymers employing solution polymerization include polymerization processes to produce poly(glycidyl methacrylate-CO-methyl methacrylate) (e.g., as disclosed in U.S. Pat. No. 2,868,760), poly(glycidyl methacrylate-CO-ethylene) (e.g., as disclosed in French Pat. No. 1,569,004), poly(glycidyl methacrylate-CO-2-ethylhexyl acrylate-CO-styrene) (e.g., as described in U.S. Pat. No. 3,127,296), and the like.

Suitable solvents which can be used in the solution polymerization of an oxirane ring-containing polymer can be selected from a variety of organic solvents, for example, aromatic hydrocarbons such as benzene, toluene and xylenes, ketones such as acetone, methyl ethyl ketone, methyl isopropyl ketone, esters such as ethyl acetate and methyl Cellosolve acetate, ethers such as dioxane and tetrahydrofuran, and haloalkanes and haloaromatics such as dichloroethane, 1,1,1-trichloroethane, chlorobenzene and dichlorobenzenes. These solvents can be used individually or as mixtures thereof. A suitable amount of solvent used in the solvent polymerization ranges from about 0.1 to 20 by weight to the weight of the monomer(s). Where the oxirane ring-containing polymer is a copolymer, suitable copolymerization parameters are disclosed, for example, in J. Brandrup, E. H. Immergut ed., *Polymer Handbook*, 2nd Ed., 11-105, John Wiley & Sons, New York (1975), and the original literature references cited therein. The reaction temperature for solution polymerization usually ranges from about 0° to about 150° C., and the time for the polymerization generally ranges from about 0.5 to about 20 hours.

Suitable polymerization initiators which can be used in solution polymerization of an oxirane ring-containing polymer include peroxides such as benzoyl peroxide, lauroyl peroxide, and azo compounds such as azobisisobutylonitrile, 2,2'-azobis(2,4-dimethylvaleronitrile) and other commercially available radical polymerization initiators. A suitable amount of the polymerization initiator used in solution polymerization to the weight of the monomer or to the total weight of monomers ranges from about 0.01 to 5% by weight.

Some specific synthesis examples are given below. Unless otherwise indicated, all parts, percents, ratios and the like are by weight.

REFERENCE EXAMPLE 1

A mixture of 2.84 g of glycidyl methacrylate (GMA) and 4.85 g of benzoyl peroxide (BPO) was added to 800 ml of methyl ethyl ketone maintained at 50° C. in a reaction vessel. Under a nitrogen atmosphere, the mixture was stirred at 50° C. for 5 hours, and the reaction was continued under reflux for 4 additional hours. The reaction mixture was allowed to cool to room temperature (i.e., about 20°–30° C., hereinafter the same), and, with vigorous stirring, was added to 10 liters of isopropyl alcohol (IPA). The precipitated poly(glycidyl methacrylate) was dried. The amount obtained was 240 g (yield: 85%).

Epoxy value: 660 m-mols/100 g; viscosity: $[\eta]=13.0$ cps (25° C., 20% methyl Cellosolve acetate (MCA) solution).

REFERENCE EXAMPLE 2

GMA (284 g) and 52 g of styrene were added to 1,350 ml of methyl ethyl ketone in a reaction vessel, and 7.5 g of BPO was added thereto. Under a nitrogen atmosphere, the reaction was performed at the reflux temperature for 5 hours. After allowing the reaction mixture to cool, the mixture was poured into 20 liters of IPA with vigorous stirring. The precipitated poly(glycidyl methacrylate-CO-styrene) was collected, and dried. The amount obtained was 254 g (yield: 75%).

Epoxy value: 533 m-mols/100 g; $[\eta]=12.0$ cps (25° C., 20% solution of MCA).

REFERENCE EXAMPLE 3

GMA (284 g) and 83.5 g of cyclohexyl methacrylate were added to 1 liter of tetrahydrofuran in a reaction vessel, and 7.5 g of 2,2-azobis(2,4-dimethyl valeronitrile) was added thereto under a nitrogen atmosphere. The reaction was carried out at 60° C. for 4 hours. The reaction mixture was allowed to cool to room temperature, and poured into 13 liters of methyl alcohol with vigorous stirring. The precipitated poly(glycidyl methacrylate-CO-cyclohexyl acrylate) was separated by filtration, and dried. The amount obtained was 277 g (yield: 75%).

Epoxy value: 535 m-mols/100 g; $[\eta]=12.8$ cps (25° C., 20% MCA solution).

REFERENCE EXAMPLE 4

217 g of glycidyl acrylate (GA) and 116 g of methyl methacrylate were added to 450 ml of acetone in a reaction vessel, and, under a nitrogen atmosphere, 3.75 g of azobis(isobutyronitrile) (AIBN) was added thereto. The reaction was performed at 60° C. for 20 hours. After allowing the reaction mixture to cool, 2 liters of acetone was added to the reaction mixture to form a uniform solution. The solution was poured into 15 liters of methyl alcohol with vigorous stirring. The precipitate was separated by filtration, and dried to obtain 89 g (yield: 79%) of poly(glycidyl acrylate-CO-methyl methacrylate).

Epoxy value: 461 m-mols/100 g; $[\eta]=13.8$ cps (25° C., 20% MCA solution).

REFERENCE EXAMPLE 5

In a pressure-resistant glass autoclave, 0.5 g of polyvinylpyrrolidone was dissolved in 500 ml of water. The autoclave was cooled with an acetone-dry ice mixture and 142 g of GMA, 31.3 g of vinyl chloride and 0.6 g of AIBN were added thereto. The autoclave was attached to a constant temperature shaking means (incubator). The mixture was heated at 60° C. and shaken for 10 hours, and then allowed to cool to room temperature. The precipitate was separated by filtration and dried to obtain 160 g of a white powder. The powder was added to 2 liters of dioxane to dissolve the powder. The solution was poured into a large quantity (i.e., 20 l) of water with stirring, and the precipitate was separated by filtration. This separation procedure was repeated three times to obtain 135 g of dried poly(glycidyl methacrylate-CO-vinyl chloride) (yield: 78%).

Epoxy value: 613 m-mols/100 g; $[\eta]=16.3$ cps (25° C., 20% dioxane solution).

REFERENCE EXAMPLE 6

130 g of 4-glycidyl styrene and 42 g of 4-chloro-styrene were added to 800 ml of dioxane containing 3.2 g of BPO, and the reaction was performed in a reaction vessel under a nitrogen atmosphere at 70° C. for 5 hours. The reaction mixture was allowed to cool to room temperature, and poured into 8 liters of IPA with vigorous stirring. The precipitate was dried to obtain 120 g of poly(4-glycidyl styrene-CO-4-chlorostyrene) (yield: 69%).

Epoxy value: 443 m-mols/100 g; $[\eta]=8.5$ cps (25° C., 15% MCA solution).

REFERENCE EXAMPLE 7

GMA (143 g) and 50 g of 4-vinylstyrene monoxide were added to 600 ml of tetrahydrofuran containing 3.4 g of AIBN, and the reaction was performed at 50° C. for 12 hours in a reaction vessel under a nitrogen atmosphere. The reaction mixture was allowed to cool to room temperature, and with vigorous stirring, poured into 10 liters of IPA. The precipitate was collected by filtration, and dried to obtain 180 g of poly(glycidyl methacrylate-CO-4-vinylstyrene monoxide) (yield: 93%).

Epoxy value: 695 m-mols/100 g; $[\eta]=13.2$ cps (25° C., 12% MCA solution).

REFERENCE EXAMPLES 8 TO 10

Three types of poly(glycidyl methacrylate-CO-methyl methacrylate) were synthesized using the following procedures. A mixture of equal amounts (by weight) of xylene and methyl ethyl ketone was mixed with GMA and methyl methacrylate in an amount equal to the total weight of GMA and methyl methacrylate. The mixture was put into an ampoule. While cooling with an acetone-dry ice mixture, the air in the ampoule was purged with nitrogen, and then the ampoule was evacuated. This procedure was repeated four times. Then, the ampoule was sealed, and the reaction was performed for 8 hours in an incubator held at 80° C. After allowing the ampoule to cool to room temperature, the ampoule was opened. The polymer solution was diluted to 10 times with a mixture of equal amounts (by weight) of xylene and methyl ethyl ketone, and then added to 10 times the resultant volume of methyl alcohol. The polymer which precipitated was separated by filtration, and dried.

The amount of the starting material monomers, the yields obtained and the epoxy values of the products produced are shown in the table below.

| | Weight of Starting Monomers | | Amount of Copolymer | Epoxy Value |
|---|---|---|---|---|
| | GMA* [g (mol%)] | MMA* [g (mol%)] | Obtained g (yield, %) | (m-mols/100 g) |
| Reference Example 8 | 1.4 (10) | 9.0 (90) | 8.3 (80) | 90 |
| Reference Example 9 | 3.6 (25) | 7.5 (75) | 9.1 (82) | 205 |
| Reference | | | | |

-continued

| | Weight of Starting Monomers | | Amount of Copolymer | Epoxy Value |
|---|---|---|---|---|
| | GMA* [g (mol%)] | MMA* [g (mol%)] | Obtained g (yield, %) | (m-mols/ 100 g) |
| Example 10 | 5.7 (40) | 6.0 (60) | 9.7 (83) | 309 |

*GMA: glycidyl methacrylate
*MMA: methyl methacrylate

The GMA and methyl methacrylate used in the above Reference Examples were obtained by treating commercially available products in a conventional manner to remove the polymerization inhibitor. More specifically, the GMA used contained 50 ppm of hydroquinone monomethyl ether as a polymerization initiator, and the methyl methacrylate used contained 1,000 ppm of hydroquinone. After washing the GMA several times with water, the GMA was distilled under a reduced pressure of 34 mm Hg to obtain a fraction of a boiling point of 100° C., which was then used as the GMA. After washing the methyl methacrylate several times with water, the methyl methacrylate was distilled under a reduced pressure of 90 mm Hg to obtain a fraction of a boiling point of 43° C., which was then used as the methyl methacrylate.

In order to introduce an ethylenically unsaturated bond into a polymer containing oxirane rings by utilizing the oxirane rings of the polymer, a monomer having at least one ethylenically unsaturated bond and a functional group capable of opening, and adding to, the oxirane rings is used. In this case, the number of functional groups capable of adding to the oxirane ring is 1. Generally, when a monomer containing two or more functional groups capable of adding to the oxirane ring is employed, naturally it would be expected that a cross-linking reaction will occur as a result of their addition to the oxirane rings, and the product would be unsuitable as a starting material for a resist material. However, the presence of two or more ethylenically unsaturated bonds in the monomer is permissible, and rather improved results have been noted with a monomer containing two or more ethylenically unsaturated bonds than were obtained with a monomer containing one ethylenically unsaturated bond. There is theoretically no upper limit on the number of ethylenically unsaturated double bonds which can be present. However, from a practical standpoint, such as avoiding complications in the polymerization reaction, the number of ethylenically unsaturated double bonds which can be present is about five or six.

Carboxyl, acyl halide, hydroxyl, thiol and secondary amino groups can be utilized as the functional group capable of opening, and adding to, oxirane rings to achieve the objects of this invention. These functional groups are present in monomers containing an ethylenically unsaturated double bond also and the functional group present in such a monomer is reacted with the oxirane rings of the polymer containing a plurality of oxirane rings as described above to ring-open the oxirane rings.

Monomers containing an ethylenically unsaturated double bond which can be used to introduce an ethylenically unsaturated group into the oxirane ring-containing polymer are specifically exemplified below.

Examples of monomers containing a carboxyl group as the functional group capable of opening and adding to oxirane rings which can be used to produce the polymer resist material of this invention are unsaturated aliphatic carboxylic acids.

The unsaturated aliphatic carboxylic acid used should be a monocarboxylic acid, i.e., contain only one free carboxyl group. Monocarboxylic acids and monoesters of di-carboxylic acids such as the monoalkyl, monoaryl or monoaralkyl esters can be used in this invention. Suitable alkyl groups of these monoesters include lower alkyl groups having 6 or less carbon atoms, such as methyl, ethyl, isopropyl, isobutyl, tert-butyl, isoamyl, 2,2-dimethylpropyl, 1,1,2-trimethylpropyl, cyclopentyl and cyclohexyl groups. Suitable aryl groups include phenyl and substituted phenyl groups, such as tolyl, xylyl, chlorophenyl, bromophenyl, cyanophenyl (including o-, m- and p-isomers) and the like. Suitable aralkyl groups include a benzyl group. Specific examples of suitable unsaturated aliphatic monocarboxylic acids are monoesters of maleic acid, monoesters of fumaric acid, monoesters of itaconic acid, acrylic acid, methacrylic acid, monoesters of cis-4-cyclohexene-1,2-dicarboxylic acid, monoesters of 5-norbornene-2,2-dicarboxylic acid, and monoesters of hexachloro-[2,2,1]-bicyclohept-5-ene-2,3-dicarboxylic acid. Where the functional group of the monomer is a carboxyl group, the reaction of the monomer with the oxirane ring-containing polymer can be conducted as follows. The oxirane ring-containing polymer is dissolved in a solvent or a mixture of solvents, for example, ethers such as dioxane or tetrahydrofuran, esters such as ethyl acetate or methyl Cellosolve acetate, aprotic solvents such as N,N-dimethylformamide or dimethyl sulfoxide and ketones such as methyl ethyl ketone or cyclohexanone. A solvent containing a free hydroxyl group such as ethyl alcohol or methyl Cellosolve can not be used, since there is the possibility of a reaction between the oxirane ring and the free-hydroxyl group-containing solvent. A suitable concentration of the oxirane ring-containing polymer in the solution is below about 50% by weight (based on the weight of the solvent or the mixture of solvents), preferably 5 to 20% by weight. An ethylenically unsaturated double bond(s) containing carboxylic acid is added to the oxirane ring-containing polymer solution in a molar amount of about 0.1 to 10 times to the oxirane rings present in the oxirane ring-containing polymer and the mixture is reacted while stirring at a temperature of about 0° to about 150° C. for about 0.5 hour to about 30 hours, preferably under an inert atmosphere such as argon or nitrogen. A catalyst can advantageously be used to promote the addition reaction of the carboxylic acid to the oxirane ring of the oxirane ring-containing polymer. Examples of suitable catalysts are tertiary amines such as triethylamine or pyridine and quaternary ammonium salts such as triethylbenzylammonium chloride or cetyltrimethylammonium bromide. A suitable quantity of the catalyst ranges from about 0.01 to 5 mol% to the oxirane ring in the oxirane ring-containing polymer.

Examples of monomers containing an acyl halide group as the functional group capable of opening, and adding to, oxirane rings which can be used to produce the polymer resist material of this invention are acryloyl chloride, methacryloyl chloride, methylvinylacetyl chloride, 3-allylpropionyl chloride, allylphenylacetyl chloride, allylbenzylacetyl chloride, monomethylmaleoyl chloride, monoethylmaleoyl chloride, monoisopropylmaleoyl chloride, monomethylfumaroyl chloride, monoethylfumaroyl chloride, monoisopropylfumaroyl chloride, and monomethylitaconoyl chloride;

and the corresponding acid bromides to these acid chlorides. Functional groups of this kind act on the oxirane rings to form a vic-chloroester or vic-bromoester. Where the functional group of the monomer is an acyl halide group, the reaction with the oxirane ring-containing polymer can be conducted using the same reaction parameters as described above for the reaction of the monomer containing a carboxyl group. In this case, the catalyst preferably used is a polyamine such as dimethylaminopropylamine (a secondary amine).

When the functional group is a hydroxyl group, both a monomer containing an alcoholic hydroxyl group and a monomer containing a phenolic hydroxyl group can be used.

Examples of monomers containing an alcoholic hydroxyl group which can be used to produce the polymer resist material of this invention include allyl alcohol, ethylene glycol monoacrylate, ethylene glycol monomethacrylate, diethylene glycol monoacrylate, diethylene glycol monomethacrylate, trimethylolpropane diacrylate, trimethylolpropane dimethacrylate, pentaerythritol triacrylate, pentaerythritol trimethacrylate, 2-hydroxyethyl acrylate, 2-hydroxyethyl methacrylate, 2-hydroxypropyl acrylate, 2-hydroxypropyl methacrylate, 4-vinylbenzyl alcohol and 4-allylbenzyl alcohol.

Examples of monomers containing a phenolic hydroxyl group which can be used to produce the polymer resist material of this invention are 4-hydroxystyrene, 2-hydroxystyrene, 3-hydroxystyrene, 2-allyl phenol, 3-allyl phenol, 2-methyl-6-allyl phenol, 2-allyl-4-methylphenol, 1-allyl-2-naphthol, eugenol, 4-allyl anisole, 3-allyl anisole, 2,6-diallyl phenol, 2,6-diallyl p-cresol, and 2,4,5-triallyl phenol.

Where the functional group of the monomer is a hydroxyl (either alcoholic or phenolic) group, the reaction with the oxirane ring-containing polymer can be conducted using the same reaction parameters as described above for the reaction of the monomer containing a carboxyl group and a vic-hydroxy ether is formed.

Examples of monomers containing a thiol group as the functional group which can be used to produce the polymer resist material of this invention include allyl mercaptan, mercaptobutene-2, mercaptobutene-3, mercaptopentene-4, mercaptopentene-1, 2-vinylthiophenol and 2-allylthiophenol. The resulting adduct with the oxirane rings in this case is a vic-hydroxythioether. Where the functional group of the monomer is a thiol group, the reaction with the oxirane ring-containing polymer can be conducted using the same reaction parameters as described above for the reaction of the monomer containing a carboxyl group. A tertiary amine such as triethylamine or piperidine is effective as a catalyst. Suitable solvents which can be used in the reaction are also the same as described above. However, an aprotic solvent such as N,N-dimethylformamide is a particularly preferred solvent, since the reaction proceeds faster in N,N-dimethylformamide than in, for example, an ester such as ethyl acetate. However, it is not essential that aprotic solvents be used.

Examples of monomers containing a secondary amino group as the functional group which can be used to produce the polymer resist material of this invention are N-methylallylamine, diallylamine, N-methylaminoethyl acrylate, N-methylaminoethyl methacrylate, N-propylaminomethyl acrylate, N-propylaminomethyl methacrylate, N-propylaminoethyl acrylate, N-propylaminoethyl methacrylate, N-benzylallylamine, N-allyl aniline, N-allyl-2-toluidine and the like. The amino group adds to the oxirane ring to produce a vic-tertiary amino alcohol. Since it is well known that a tertiary amine becomes a curing catalyst for an epoxy resin by opening the oxirane ring, it would be expected that in this case a complete or a localized curing of the oxirane ring-containing polymer would take place depending upon the selection of the polymer, the monomer containing a secondary amino group as the functional group, and the reaction conditions. It is possible, however, to prevent gellation caused by the same mechanism as the curing of an epoxy resin by appropriately selecting the polymer, the monomer containing a secondary amino group and the reaction conditions. More specifically, a secondary amine containing ethylenically unsaturated double bond(s) and an oxirane ring-containing polymer are reacted in a solvent at a concentration of at most 50% by weight of the polymer, preferably 20% by weight or less. The reaction temperature should not exceed about 60° C. to avoid undesirable partial hardening of the oxirane ring-containing polymer by virtue of the catalytic action of the amine. Partial gellation (or hardening) can easily be detected by the formation of an insoluble polymer in the reaction mixture. The quantity of a secondary amine containing unsaturated double bond(s) which can be added to the reaction mixture is one to five molar equivalents to the oxirane rings of the polymer. Maintaining the concentration of the polymer solution below the above-described limit is most important to avoid gellation via cross-linking. A suitable reaction time ranges from about 0.5 hour to about 100 hours. An amine or quaternary ammonium salt catalyst does not always have to be used since the secondary amine per se has catalytic properties.

Monomers containing an aldehyde or ketone group as the functional group, such as acrolein, crotonaldehyde, allyl acetaldehyde, methyl vinyl ketone, divinyl ketone, or diallyl ketone, add to oxirane rings to form acetals, but have not been found to be suitable for production of the polymer resist material of this invention.

Cyano, urea, and urethane derivative groups are also available as functional groups, but as is the case with the aldehyde or ketone groups, polymer materials suited for the object of the invention cannot be obtained when these groups are used.

The specific examples of the monomers that can be used to prepare the oxirane ring-containing polymers, and the monomers utilized to introduce an ethylenically unsaturated double bond into the oxirane ring-containing polymer, etc., as given hereinabove, are set forth merely for the purpose of illustration, and are not to be construed as limiting the present invention.

The addition reaction of a monomer containing an ethylenically unsaturated double bond(s) and a functional group to an oxirane ring-containing polymer can be monitored by determining the remaining unreacted epoxy content by periodically sampling the reaction mixture. The reaction mixture after the completion of the reaction is poured into a large amount (e.g., 5 times to 100 times by weight of the reaction mixture) of a non-solvent for the polymer such as water (where the solvent used in the reaction is water-miscible), an alkane such as n-hexane, a cycloalkane such as cyclohexane, or an alcohol such as methyl alcohol or isopropyl alcohol, and the resulting precipitated polymer is then recovered, e.g., by filtration. The polymer can be purified by reprecipitation and drying at a temperature below about 80° C. under a reduced pressure. However, since the reaction product usually contains unreacted oxirane rings, the reaction product tends to become insoluble on drying. As a partial result of this, it is better to separate the product and to dry the product after eliminating any remaining oxirane rings in the polymer by treatment with a ring opening agent such as hydrogen chloride in situ (e.g., subsequently in the same reaction mixture). As it is customary in the preparation of a polymer containing an ethylenically unsaturated bond, in the above addition reaction of the monomer containing a functional group reactive with an oxirane ring and at least one ethylenically unsaturated double bond with the oxirane ring-containing polymer, a thermal polymerization inhibitor such as hydroquinone or p-methoxyphenol can advantageously be added in an amount of about 0.1% by weight to 1% by weight based on the weight of the functional group containing monomer.

As exemplified above, a polymer having an ethylenically unsaturated bond can be obtained by introducing an ethylenically unsaturated double bond into the oxirane ring-containing polymer using a monomer having a functional group capable of adding to the oxirane ring of the polymer. As a matter of course, the degree to which groups containing an ethylenically unsaturated double bond are introduced into the oxirane ring-containing polymer in this reaction whereby an ethylenically unsaturated double bond is introduced into the polymer depends upon the chemical properties of the monomer containing the functional group and those of the oxirane ring-containing polymer, and the reaction conditions. It is known, however, that generally it is virtually impossible to add a functional group-containing monomer to all oxirane rings of the polymer and to open all of the oxirane rings. Unreacted oxirane rings which remain are disadvantageous because the storage stability of the resist material is reduced, development residues are formed after irradiation of high energy radiation and the edge sharpness of the resulting pattern is poorer with formation of "whiskers" or "scum". The term "scum" is used herein to describe a lumpy deposit of an indefinite shape which remains in the unexposed portion of the resist material after development. The term "whisker" is used herein to describe a development residue which projects in a form like that of icicles or whiskers from the boundary of the exposed portion into the unexposed portion. These development residues cause marked degradation of the resolving power of the polymer resist material. Thus, when after the introduction of an ethylenically unsaturated double bond into the oxirane ring-containing polymer, a ring-opening agent capable of opening and eliminating the remaining unreacted oxirane rings (to be referred to hereinafter as a ring-opening agent for brevity) is used and a resist material which has very good stability and gives a pattern having good resolution without any development residue is obtained.

Hydrogen halides such as hydrogen chloride, hydrogen bromide, hydrogen fluoride, and hydrogen iodide, hydrogen sulfide, and hydrogen cyanide can be advantageously used as ring-opening agents of this kind. These agents open oxirane rings to form halohydrins, vic-hydroxythiols, and cyanohydrins, respectively.

Oxyacids of halogens such as chloric acid, perchloric acid, bromic acid, perbromic acid, iodic acid, and periodic acid can also be the ring-opening agents. In this case, vicdiols are mainly formed.

It is also possible to use Grignard reagents, ammonia, nitric acid, and boron trifluoride, especially a boron trifluoride/acetic acid adduct. Grignard reagents such as alkyl magnesium halides do not react with ethylenically unsaturated double bonds, but act on ester bonds. Hence, Grignard reagents cannot be used for polymers having an ethylenically unsaturated bond introduced thereinto by way of an acyl halide group. In this case, an alcohol forms from the oxirane ring.

Ammonia induces ring-opening of the oxirane ring with the formation of an amino alcohol.

Nitric acid induces ring-opening of the oxirane ring mainly with the formation of vic-hydroxynitric acid esters. However, the properties of the product obtained vary from batch to batch, and control is difficult.

Boron trifluoride can be used as an adduct with an organic acid such as acetic acid. As would be naturally anticipated, a cross-linked insoluble material is formed, and the soluble portion has a large molecular weight distribution. Even when the soluble portion is used as a resist material, its storage stability is poor, and its utilitarian value is somewhat inferior. As a result, boron trifluoride adducts are less preferred as ring opening agents.

When an acyl halide group is used as the functional group in introducing an ethylenically unsaturated double bond into the oxirane ring-containing polymer, the monomer containing an ethylenically unsaturated double bond and the functional group is reacted in a molar amount in excess of that of the oxirane rings of the oxirane ring-containing polymer. If, after the reaction of introducing the ethylenically unsaturated group double bond is completed, the acyl halide group is decomposed by adding water in an amount which does not cause a precipitation of the polymer in the reaction mixture solution, hydrogen chloride is formed and acts as a ring-opening agent. Hence, this is a very convenient approach from an operational standpoint.

When groups other than acyl halide groups are utilized as functional groups for introducing an ethylenically unsaturated double bond into the oxirane ring-containing polymer, it is advantageous to perform the reaction using a method which involves adding a ring-opening agent to the reaction mixture after the reaction to introduce the ethylenically unsaturated double bond is completed, thereby eliminating the oxirane rings, and then separating the product.

The addition reaction to introduce an ethylenically unsaturated double bond and the reaction to open the remaining oxirane rings by reaction of a ring-opening agent can be carried out in a solvent which is inert to the reaction components. Desirably, the solvent is a good solvent for the starting reactant mixture and the polymer reaction product obtained. For example, depending upon the type of reactant mixture and the reaction conditions used, the solvent can be selected from esters such as methyl Cellosolve acetate, ethyl Cellosolve acetate, and acetic acid esters such as methyl acetate, ethyl acetate, isopropyl acetate, isoamyl acetate, etc., ketones such as acetone, methyl ethyl ketone, and methyl isopropyl ketone, ethers such as dioxane and tetrahydrofuran, and aprotic polar solvents of which dimethylformamide, dimethyl sulfoxide and hexamethylphosphoramide are typical.

To the solution of the ethylenically unsaturated double bond-containing polymer (obtained via the addition reaction of a monomer containing an ethylenically unsaturated double bond(s) and a functional group to an oxirane ring-containing polymer as described above), a ring opening agent such as hydrogen chloride, hydrogen bromide, hydrochloric acid or compounds as described hereinbefore as ring opening agents is added as a gas or as an aqueous or an organic solvent solution thereof in an amount from an equimolar amount to the residual unopened oxirane rings to 100 times molar excess to obtain a polymer which contains practically no oxirane rings. A suitable concentration of the polymer solution is below about 50% by weight, preferably 5 to 20% by weight. Suitable solvents which can be used in this reaction include, for instance, dioxane, tetrahydrofuran, cyclohexanone, methyl ethyl ketone, N,N-dimethylformamide, methyl Cellosolve acetate, glycol dimethyl ether and the like. In this oxirane ring elimination reaction, a tertiary amine, a quaternary ammonium halide, a quaternary ammonium hydroxide, such as trimethylbenzylammonium hydroxide, and boron trifluoride etherate can effectively be used to promote the reaction. A suitable reaction time ranges from about 0.5 hour to about 100 hours. The end point of the oxirane ring elimination reaction can be monitored by a determination of the epoxy content.

As has already been described, this oxirane ring elimination reaction is desirably conducted using the reaction mixture of the ethylenically unsaturated double bond insertion (introduction) reaction. After the oxirane ring elimination reaction, the polymer useful as a resist material can be separated by pouring the reaction mixture into a large amount of a non-solvent (e.g., about 5 times to about 100 times by weight to the reaction mixture) for the polymer such as isopropyl alcohol. The crude product can be purified by repeating reprecipitation using a good solvent for the polymer and a non-solvent for the polymer. After drying in vacuo or under a reduced pressure at a temperature below about 120° C., preferably below 80° C., the polymer resist material of this invention is obtained.

It is already known, as described hereinbefore, that the oxirane ring-containing polymer itself which is a starting material for the resist material of this invention is curable by irradiation with high energy radiation such as electron beams. However, it has been confirmed that the polymer resist material of this invention produced as described above has a sensitivity to high energy radiation about 10 to 20 times higher than the sensitivity of the oxirane ring-containing polymer starting material, and has outstandingly superior resolution and stability which are extremely important properties of resist materials for micro-working. A comparison with the starting material is described in Example 1 given hereinafter.

The resist material of this invention can be coated on a substrate in the form of a solution in an appropriate solvent or in a mixture of solvents, then the solvent or the mixture of solvents is evaporated off by heating to leave a thin film of the resist material on the surface of the substrate.

Suitable solvents which can be used to form a solution of the resist material of this invention include those having a boiling point below about 280°–300° C., preferably below 150° C., at atmospheric pressure, e.g., esters such as methyl Cellosolve, acetate, ethyl Cellosolve acetate and ethyl acetate, ketones such as acetone, methyl ethyl ketone and cyclohexanone, ethers such as tetrahydrofuran and dioxane, aprotic solvents such as N,N-dimethylformamide, dimethylsulfoxide, and hexamethylphosphoramide.

The concentration of the solution of the resist material will vary depending on the properties of the polymer, the use conditions, etc. However, in general, a suitable concentration of the resist material is about 5 to about 30% by weight in the solution.

The resist material solution can be coated on the surface of a substrate, e.g., a silicon wafer, a chromium-mask substrate and other materials to be processed, using, e.g., a spinner, and dried by heating to about 80° C. Thus, a good film having a thickness of about 30,000 Å to 3,000 Å and free from pinholes is formed. A film having a thickness of more than 100,000 Å can also be formed depending upon the purpose of use.

More specifically, suitable coating techniques which can be used to coat a solution of the resist material of this invention include conventional coating techniques such as spray coating, dip coating, blow coating, whirler coating, and roller coating. These coating methods are described in detail in C. A. Harper ed., *Handbook of Materials and Processes for Electronics*, 14 pp. 45–55, McGraw-Hill Book Co., New York (1970). The resist material, however, is preferably coated using a spinner which is a type of whirler coater suitable to produce a thin film usually of a thickness of less than 1μ. The coated thickness of the resist material of this invention can range from about 0.1μ to about 100μ, preferably 0.3μ and 5μ (or 3,000 Å and 50,000 Å). The thinner the thickness of the film of the resist material is, the finer the image pattern can be obtained, in general, on a substrate. If the film thickness of the resist material is too thin, inevitably many uncoated portions, i.e., pin-holes occur on the coated surface. From this standpoint, the lower limit of the thickness of the film of the resist material of this invention is approximately 3,000 Å. Although even finer patterns could be made, it is safe to assume that the minimum line-width of the patterns attained with the resist material of this invention might be one half of the thickness of the film. For example, when the thickness of the film of the resist material is 1μ, the minimum line-width of the pattern would appear to be 0.5μ. Strictly speaking, the minimum line-width cannot be determined solely by the thickness of the resist film.

Usually, a thin film of the resist material on a substrate is baked before irradiation with high energy radiation, partially to eliminate any residual solvent still remaining in the dried film and partially to strengthen the adhesion of the resist film to the substrate. This baking process is known in the art as "prebaking". The resist material of this invention can be prebaked, preferably under an inert atmosphere such as nitrogen, at a temperature between about 60° C. and about 120° C. for 10 minutes to 2 hours.

When the film is irradiated with high energy radiation such as electron beams, X-rays, ion beams, β-rays, γ-rays or neutron beams, the exposed portion of the film is cured and becomes insoluble in a solvent. When the exposed material is washed with an appropriate solvent, the unexposed uncured portion dissolves, and a pattern formed by the cured resist film remains on the surface of the substrate. Formation of patterns of this type can be performed using methods well known in the art.

As described above, the resist material of the present invention is non-curable by irradiation with electromagnetic radiation having a wavelength of about 300 nm or more, e.g., electromagnetic radiation in the ultraviolet, near-ultraviolet, visible and infrared regions. However, the resist material of the present invention is photosensitive to electromagnetic radiation having a wavelength of about 200 to about 260 nm, i.e., the so-called deep ultraviolet region, and is curable therewith. Pattern formation utilizing electromagnetic radiation with such a wavelength is well known in the art as deep ultraviolet lithography (as described in, for example, B. J. Lin, *Journal of Vacuum Science and Technology*, Vol. 12, No. 6, p. 1317 (1975)). The resist material of the present invention is particularly useful for deep ultraviolet lithography.

Suitable sources of deep ultraviolet light which can be used are a so-called germicidal lamp (wavelength: 2,537 Å), a low pressure mercury lamp, a xenon-mercury lamp (wavelength: about 2,000 to 2,600 Å) which is commercially available from Ushio Electric Co., Tokyo, Model UIS-500C, or a heavy hydrogen lamp (wavelength: about 2,000 Å or shorter). In this case, an original made from a hard or soft mask (e.g., a chrome image or a silver halide image, respectively) on an artificial quartz support must be used, since a natural quartz support is not transparent to deep ultraviolet light.

The resist material of the present invention can also be used for electron beam lithography.

The most important method of forming a resist image in electron beam lithography is where an electron beam having a Gaussian beam current distribution is scanned over a resist material coated substrate. The electron beam addresses each feature to be exposed, e.g., as directed by a computer. The areas of the resist material film struck by the electron beam are cured and become practically insoluble in a developer. Where the acceleration voltage of the electron beam ranges from about 5 KV to about 30 KV, the dosage required to insolubilize 50% of the initial thickness of the resist film of this invention is about $10^{-7}$ to about $10^{-6}$ coulomb/cm$^2$. Various electron beam systems for electron beam lithography including an irradiation apparatus with an addressing means and a computer are obtainable commercially as described, for instance, in R. T. Miller, *Solid State Technology*, pp. 25–29, (July, 1973). A suitable time for exposure to form resist images on a silicon wafer of a size of 5"×5" is several minutes to several hours. The exposure time required can be shortened by exposing simultaneously using over twenty Gaussian round electron beam spots using a system such as that described, for example, in J. L. Mauer et al., *IBM J. Res. Develop.*, pp. 514 to 521, (Nov. 1977).

The resist material of this invention can also be used for X-ray lithography, as well. X-rays of a wavelength of between 4 Å and 14 Å are usually employed for producing a resist image. One example of an X-ray apparatus which can be used for producing a resist image in this invention is a Rota Unit RU-200 PL, manufactured by Rigaku Denki Co., Tokyo. The original or a master mask for X-ray lithography can be generated using electron beam lithography. The sensitivity of the resist material of this invention ranges from about 20 to about 80 mJ/cm$^2$. In this connection, X-rays from a synchrotron orbital radiation apparatus (for instance, as described in D. A. Shirley et al., *Phys. Rev.*, B15, p. 544 (19770) can advantageously be used as a radiation source.

The resist material of this invention provides a negative image of the original using the contact exposure of deep ultraviolet light. It is worth noting that most negative working electron beam resist materials provide very poor positive images using deep ultraviolet light irradiation. In this case, a thin film of the resist material of a thickness from about 2μ to about 5μ can be laminated on a substrate instead of coating a solution of the resist material. Thus, as a dry film the resist material of this invention can be used in deep ultraviolet lithography. A suitable irradiation time necessary for producing the resist image of this invention of a thickness of 1μ using the commercially available xenon-mercury lamp (UIS-500C) described above is less than 5 minutes.

The resist material of this invention irradiated with high energy radiation is developed to produce a resist image on the substrate by immersion in or spraying with a developer. Suitable developers which can be used include ethyl acetate, isoamyl acetate, methyl Cellosolve acetate, methyl Cellosolve, methyl ethyl ketone, cyclohexane, tetrahydrofuran, ethyl alcohol, isopropyl alcohol, cyclohexane, benzene, toluene, xylenes, dichloroethanes and dichloromethane and mixtures thereof. The time required for development usually ranges from several seconds to ten minutes in case of manual treatment at a temperature of about 20° to 30° C. The developed resist image, or simply resist, is preferably rinsed with a solvent as described above.

The developed, and preferably rinsed, resist is then subjected to a postbaking to expel residual developer or rinsing solvent trapped in the resist at a temperature between about 60° C. and about 250° C., preferably between 80° C. and 180° C., for about 10 minutes to 2 hours. The postbaked resist can then be used for various fabrications described hereinafter, similar to processes utilized in photofabrication. The resist is usually then removed from the surface of the substrate, except if the resist is to be used as a barrier coating. The resist can be removed with mechanical rubbing using a cellolose sponge after it has been swelled with a solvent such as acetone or cyclohexanone. Plasma ashing, e.g., as described in E. Spiller et al., *Solid State Technology*, pp. 62–67 (April 1976) is a more suitable method for removal of the resist.

The resist of this invention can be employed in processes used in producing microelectronic devices, such as chemical and physical etching, plating, vacuum evaporation, sputtering and doping, each of which is described in detail in C. A. Harper, supra, 14, pp. 66–114, Henry I. Smith, *Proceedings of the IEEE*, 62 (10), pp. 1361–1387 (1974), E. Spiller, R. Feder et al., *Solid State Technology*, pp. 62–67 (April 1976), R. F. W. Pease et al., *IEEE Transactions on Electron Devices*, Vol. ED22, No. 7, pp. 393–398 (July 1975). More specifically, in fabricating a chrome mask to be used as a master mask for photolithography, employing an electron beam system, the thickness of the resist on a chrome mask ranges from about 4,000 Å to about 8,000 Å. The thickness of the resist for processing a silicon wafer ranges from about 6,000 Å to about 10,000 Å. The resist formed from the resist material of this invention can be used without difficulties in chemical and physical milling, including reactive sputter-etching, doping, vacuum vaporation of a metal and the like. The resist material of this invention can also be employed in making bubble memories (e.g., as disclosed in E. Spiller et al., *Solid State Technology*, pp. 62–67 (April, 1976)) and surface acoustic wave devices (e.g., as disclosed in H. I. Smith, *Proceedings of the IEEE*, 62 (10), pp. 1361–1387 (1974)). A suitable thickness of the resist material of this invention for both of these devices ranges from about 3,000 Å to about 8,000 Å. Using the resist material of the present invention, micropattern making with a minimum linewidth of less than 1μ can be attained.

A resist material composition can include, in addition to the resist material of this invention, a thermal polymerization inhibitor such as hydroquinone, p-methoxyphenol, 2,4-di-tert-butyl-p-cresol, nitronaphthalenes, cupferron and the like in an amount of about 10 ppm to about 10,000 ppm. The resist material composition can also include generally used plasticizers such as dibutylphthalate, dioctylphthalate, e.g., in an amount of below about 30% by weight to provide film forming capability and improve the characteristics of the film of the resist material (e.g., homogeneity of the film, adhesiveness to the substrate, flexibility and the like). However, in the case of an electron beam or X-ray resist material, very seldom are other substances than the resist material itself present in the resist material composition. This is very different from resist material compositions used in photolithography. As is well known, photoresist materials are generally composed of a polymer containing functional groups such as unsaturated bonds, azide or diazooxide groups, polyfunctional oligomers, photosensitizers, colorants, inhibitors, stabilizers, leveling agents, thioxotropic agents and adhesive components. These additives can be present along with the resist material of this invention, as a main component, as long as these additives do not impair the advantages obtained with the resist material of this invention, such as sensitivity, ability to reproduce patterns with extremely narrow line widths, etc.

The present invention is described in greater detail by reference to the following Examples.

EXAMPLE 1

Dioxane (500 ml) was placed in a reaction vessel, and 44.8 g of the poly(glycidyl methacrylate) produced as described in Reference Example 1, 80 g of monomethylmaleoyl chloride, 0.2 g of p-methoxyphenol as a thermal polymerization inhibitor for an ethylenically unsaturated double bond, and 2.0 g of triethylbenzyl ammonium chloride as a catalyst were added. The reaction was performed at 80° C. for 2 hours in a nitrogen atmosphere with stirring. The reaction mixture was maintained at 40° C., and 10 ml of water was added to decompose the unreacted acid chloride and the remaining oxirane rings were opened with the hydrogen chloride that was formed. The reaction mixture was poured into 5 liters of water. The precipitate was recovered, pulverized using a mixer (equipped with a cooling mantle), and washed with water until no chlorine ion was detected. The product was dried in a vacuum at 60° C. to obtain 93 g of a methyl maleate of the polymer (epoxy value: 0.0 m-mol/100 g).

The resist material obtained as described above was dissolved in methyl Cellosolve acetate, coated with a rotary coater on a silicon substrate with the surface having a silicon oxide layer thereon, and prebaked at 80° C. for 30 minutes to form a sample with a thin film having a thickness of 4,500 Å on the oxide coating.

This thin film was irradiated with electron beams using an Electron Beam Resist Evaluation Apparatus produced by AKASHI SEISAKUSHO CO., LTD., Japan, employing an acceleration voltage of 27 KV, and the exposed film was immersed for 30 seconds in methyl Cellosolve acetate, and then rinsed with butyl acetate.

If the minimum charge in coloumbs per square centimeter (coul/cm²) at which the resist film remains after development is $D_g^i$ and if the charge required for 50% of the coating thickness to remain as $D_g^{0.5}$, then the contrast $\gamma$ is given by $$\gamma = \frac{0.5}{\log D_g^{0.5} - \log D_g^i}$$

(e.g., as disclosed in L. F. Thompson, *Solid State Technology*, No. 7, page 27 (1974)).

When $D_g^{0.5}$ is taken as a measure of the sensitivity of the resist material, a smaller $D_g^{0.5}$ value shows a higher sensitivity.

The resist material obtained above had a $D_g^{0.5}$ of $1.5 \times 10^{-7}$ coul/cm², and a $\gamma$ of 2.2.

Then, the spot diameter of the electron beams was narrowed to about 200 Å, and another sample produced as described above was irradiated with electron beams. When the exposed material was developed, a line and space each of a width of $0.2\mu$ (this shows that many parallel lines of a cured film with a line width of $0.2\mu$ could be formed at intervals of $0.2\mu$) could be resolved.

When the above procedures of coating on a silicon substrate with the oxide coating were repeated using the starting poly(glycidyl methacrylate) employed to produce the resist material in this Example, the starting poly(glycidyl methacrylate) was found to have a $D_g^{0.5}$ of $3.0 \times 10^{-6}$ and a $\gamma$ of 1.7. The sensitivity of the starting poly(glycidyl methacrylate) was about 1/20 of that of the resist material produced in this Example, and the $\gamma$ was low. The edge sharpness of the image was very poor, and there was a large amount of development residue.

EXAMPLE 2

Methyl ethyl ketone (150 ml) was placed in a reaction vessel, and 11 g of the poly(glycidyl methacrylate-CO-styrene) produced as described in Reference Example 2, 20 g of allylphenylacetyl chloride, 1.0 g of triethylbenzyl ammonium chloride as a catalyst and 0.5 g of p-methoxyphenol as a thermal polymerization inhibitor were added thereto. The reaction was performed at the reflux temperature for 2 hours with stirring in a nitrogen atmosphere. After the reaction mixture was allowed to cool to 30° C., 2 ml of water was added thereto, and the mixture was stirred at 30° C. for 2 hours. The reaction mixture was poured into 1 liter of isopropyl alcohol with vigorous stirring. The precipitate was separated by filtration, and then added to 2.5 liters of water to precipitate the product. The precipitate was collected by filtration, pulverized using a mixer, and washed with water until no chlorine ion was detected. This recovery procedure was repeated, and the product was dried in vacuum at about 60° C. to obtain 17 g of an allylphenyl acetate of the polymer (epoxy value: 0.0 m-mol/100 g).

The resist material thus-obtained was coated on a silicon substrate as described in Example 1 and then was irradiated with electron beams in the same manner as described in Example 1. The following results were obtained.

$D_g^{0.5} = 2 \times 10^{-6}$ coul/cm², $\gamma = 1.3$. A line and space of a width of $0.2\mu$ was resolved.

The pattern with a line and space of a width of $0.2\mu$ on the silicon substrate produced as above was heated at 260° C. for 30 minutes, the edge of the lines was still sharp and was not blunted or rounded by the heat treatment, and the pattern had superior thermal stability.

EXAMPLE 3

10 g of the poly(glycidyl methacrylate-CO-cyclohexyl methacrylate) produced as described in Reference Example 3 was dissolved in 60 ml of methyl Cellosolve acetate in a reaction vessel, and 14 g of 2,6-diallyl phenol and 1 g of tributylamine as a catalyst were added thereto. The reaction was carried out with stirring at 80° to 90° C. for 8 hours in a nitrogen atmosphere. The reaction mixture was allowed to cool to 25° C., and then hydrogen sulfide was introduced thereinto to open the unreacted oxirane rings. The end point of the ring-opening reaction was measured by the epoxy value of the product. Nitrogen was bubbled into the reaction mixture to remove the excess of hydrogen sulfide. 120 ml of methyl Cellosolve was added to the reaction mixture to prepare a uniform solution. The solution was poured into 1 liter of isopropyl alcohol with vigorous stirring. The precipitate was separated by filtration, washed with isopropyl alcohol, and dried in a vacuum at 60° C. to obtain 13.4 g of a diallyl phenol ether of the polymer.

A thin film of the resist material thus-obtained was formed on a substrate for production of a chromium mask. The thin film was irradiated with electron beams as described in Example 1 and the following results were obtained.

$D_g^{0.5} = 7.5 \times 10^{-7}$ coul/cm$^2$, $\gamma = 1.8$. A line and space of a width of 0.5$\mu$ was resolved. The pattern with a line and space of a width of 0.5$\mu$ on the substrate was post-baked at 220° C. for 30 minutes, immersed in a chrome etching solution (a mixture of 17 g of ammonium cerium nitrate, 5 ml of 70% hydrogen peroxide and 100 ml of water) at 22° C., washed with water, and dried to form a mask having good definition.

EXAMPLE 4

A diallyl phenol ether (11 g) of the polymer was obtained by repeating the same reaction and post-treatment procedures as described in Example 3 except that 8 g of the poly(glycidyl methacrylate-CO-vinyl chloride) produced as described in Reference Example 5 was employed instead of 10 g of the polymer produced as described in Reference Example 3.

A substrate was coated with the resulting polymer and was irradiated with electron beams as described in Example 1. The following results were obtained.

$D_g^{0.5} = 4 \times 10^{-7}$ coul/cm$^2$, $\gamma = 1.0$. A single line of a width of 0.5$\mu$ was resolved.

EXAMPLES 5 to 8

Glycidyl-containing polymers synthesized as described in Reference Examples 4, 8, 9 and 10, respectively, were each reacted with monomethylfumaroyl chloride to produce monomethyl fumarate esters of the respective polymers in accordance with the procedures described in Example 1. The polymers produced and the results obtained after coating on a substrate and irradiation with electron beams as described in Example 1 are summarized in the table below.

| Example No. | Glycidyl-Containing Polymer | Proportion of Glycidyl-Containing Monomer in Polymer (mol %) | 0.5 $D_g$ (coul/cm$^2$) | $\gamma$ | Minimum Line Width of Single Line Resolved $\mu$ |
|---|---|---|---|---|---|
| Example 5 | Poly(glycidyl acrylate-CO-methyl methacrylate) (Reference Example 4) | 53 | $2 \times 10^{-7}$ | 2.0 | 0.2 |
| Example 6 | Poly(glycidyl methacrylate-CO-methyl methacrylate) (Reference Example 8) | 9.3 | $3.5 \times 10^{-6}$ | 1.3 | 0.5 |
| Example 7 | Poly(glycidyl methacrylate-CO-methyl methacrylate) (Reference Example 9) | 22.5 | $1.2 \times 10^{-6}$ | 1.8 | 0.3 |
| Example 8 | Poly(glycidyl methacrylate-CO-methyl methacrylate) (Reference Example 10) | 35.5 | $7 \times 10^{-7}$ | 1.5 | 0.3 |

EXAMPLE 9

Tetrahydrofuran (600 ml) was placed in a reaction vessel, and 15.5 g of the poly(glycidyl methacrylate-CO-4-chlorostyrene) produced as described in Reference Example 6 was dissolved therein. Then, 0.1 g of p-methoxyphenol as a thermal polymerization inhibitor and 8 g of diallylamine were added. The reaction was performed in a nitrogen atmosphere at the reflux temperature for 12 hours with stirring. After the reaction mixture was allowed to cool to room temperature, ammonia was bubbled into the mixture at 20°-25° C. to open the unreacted oxirane rings. Then, the reaction mixture was poured into 2 liters of isopropyl alcohol. After standing, the precipitate was separated by filtration, and the precipitate in a slurry state was placed in water. The mixture was stirred, and again filtered. The filtrate was washed with water and then with ethyl alcohol, and dried at 50° C. in a vacuum to obtain 17 g of a diallylamine of the polymer.

The resist material thus-obtained was coated on a substrate and was irradiated with electron beams as described in Example 1 and the following results were obtained.

$D_g^{0.5} = 3 \times 10^6$ coul/cm$^2$, $\gamma = 0.8$. A single line of a width of 0.6$\mu$ was resolved.

EXAMPLE 10

Methyl ethyl ketone (300 ml) was placed in a reaction vessel, and 14.3 g of the poly(glycidyl methacrylate-CO-p-vinylstyrene oxide) produced as described in Reference Example 7 was dissolved therein. Further, 0.1 g of p-methoxyphenol and 25 g of monoethylmaleoyl chloride were added thereto. The reaction was performed under the same conditions as described in Example 1, and the reaction mixture was worked up to obtain 28 g of a monoethyl maleate of the polymer.

The resist material thus-obtained was formed into a thin layer with a thickness of 6,000 Å on a substrate for production of a chrome mask, and the thin film was irradiated with X-rays (Mo L 5.4 Å). The amount of X-ray irradiation ($D_g^{0.5}$) required for 50% (3,000 Å) of the film thickness to remain on development was 23 mJ/cm$^2$.

EXAMPLE 11

N,N-Dimethylformamide (500 ml) was placed in a reaction vessel, and 44.3 g of poly(glycidyl methacrylate) produced as described in Reference Example 1, 72.8 g of 3-vinylthiophenol and 2.0 g of dimethylaminopropylamine as a catalyst were added thereto. The reaction was carried out at 80° C. for 4 hours in a nitrogen atmosphere with stirring. Then, 6 ml of a 15% hydrochloric acid aqueous solution was added to the reaction mixture, and the mixture was reacted at 30° C. for 5 hours.

The reaction mixture was poured into 3 liters of methyl alcohol with vigorous stirring. The precipitate was separated by filtration, and the wet cake wet with methyl alcohol was poured into water, and washed completely with water, followed by again separating the product by filtration. The product was dried in vacuum at 60° C. to obtain 68.5 g of a vinyl thiophenol ether of the polymer.

The resist material was coated on a substrate and irradiated with electron beams as described in Example 1. The following results were obtained.

$D_g^{0.5} = 8.5 \times 10^{-7}$ coul/cm$^2$, and $\gamma = 1.2$. A line and space of a width of 1$\mu$ was resolved.

EXAMPLE 12

In the same manner as described in Example 11, poly(glycidyl methacrylate) was reacted with 3-vinylthiophenol. The reaction mixture was poured into 2 liters of methyl alcohol with vigorous stirring. The precipitate was collected by filtration, and in the form of a wet cake, again treated with 2 liters of methyl alcohol. The precipitate was separated by filtration. The wet cake was added to 600 ml of dioxane to dissolve the precipitate, a mixture of 0.6 g of periodic acid (HIO$_3$.2H$_2$O) and 10 ml of water was added thereto, and the mixture was stirred at 20° C. for 4 hours. Then, the solution was poured into 4 liters of methyl alcohol. The precipitate was separated by filtration, washed completely with water, and dried in a vacuum at 60° C. to obtain 72 g of a vinylthiophenol ether of the polymer.

The resist material was coated on a substrate and was irradiated with electron beams as described in Example 1. The following results were obtained.

$D_g^{0.5} = 4.3 \times 10^{-7}$ coul/cm$^2$, $\gamma = 1.0$. A line and space of a width of 2$\mu$ was resolved.

EXAMPLE 13

44.8 g of polyglycidyl methacrylate (having a number average molecular weight of 20,000 and an epoxy value of 660 millimols/100 g) and 62.4 g of monomethyl maleate were dissolved in 50.0 cc of dioxane, and 2.0 cc of triethylamine was added as a catalyst. The mixture was maintained at 101° to 102° C. and stirred for 2 hours. The reaction temperature was then decreased to 30° to 35° C., and dilute hydrochloric acid (48 cc of 35% hydrochloric acid and 100 cc of water) was added thereto. The mixture was stirred and one hour later, the reaction mixture was poured into 5 liters of water. The polymer which precipitated was recovered, pulverized using a mixer, and washed with water until no chlorine ion was detected. The polymer was then dried under reduced pressure at 50° C. The yield of the polymer was 58.0 g, and the epoxy value of the polymer was 4.3 millimols/100 g. Thus, substantially all epoxy groups had reacted.

The resist material was dissolved in methyl Cellosolve acetate, and the solution was coated with a spinner on a silicon wafer whose surface was covered with a silicon oxide layer. The coated was pre-baked at 80° C. for 30 minutes to form a sample with a thin film having a thickness of 5,000 Å on the silicon substrate.

The thin film was exposed to electron beams in vacuum at an acceleration voltage of 27 KV. The exposed resist material was immersed for 30 seconds in methyl Cellosolve acetate at 35° C. to wash out the unexposed portion, and then rinsed with n-butyl acetate. Another sample was produced as described above but using the starting polyglycidyl methacrylate (PGMA) used to produce the resist material and subjected to the same electron beam exposure procedures.

The results are shown in the table below.

|  | $D_g^i$ (coul/cm$^2$) | $D_g^{0.5}$ (coul/cm$^2$) | $\gamma$ |
| --- | --- | --- | --- |
| Resist Material of Example 13 | $2.4 \times 10^{-7}$ | $5.4 \times 10^{-7}$ | 1.4 |
| Reference Material (starting PGMA) | $3.0 \times 10^{-6}$ | $6.0 \times 10^{-6}$ | 1.7 |

The thin film of the resist material formed in the manner described above was irradiated with narrowly reduced electron beams with a spot diameter of 200 Å at an acceleration voltage of 27 KV, and subjected to the same development treatment as described above to form resist lines having a width of 2,500 Å and a thickness of 5,000 Å which had good sharpness with no whiskers or development residues being observed.

Heat fog did not form with this thin film even when such was pre-baked at 100° C. for 30 minutes.

A solution in methyl Cellosolve acetate of the resist material, when stored at room temperature in a brown-colored bottle for one year, did not degenerate nor was any change in performance observed.

EXAMPLE 14

2.8 g of polyglycidyl methacrylate as described in Example 13 and 2.6 g of monomethyl fumarate were dissolved in 50 cc of dioxane, and 0.5 cc of triethylamine was added thereto as a catalyst. The mixture was maintained at 101° to 102° C. and stirred for 2 hours. The mixture was allowed to cool, and then a dimethylformamide solution of hydrochloric acid (3 of 35% hydrocloric acid and 20 cc of dimethylformamide) was added thereto, and the mixture was stirred at 30° to 35° C. One hour later, the reaction mixture was poured into 1 liter of water. The polymer which precipitated was separated and recovered, pulverized with a mixer, and washed with water until no chhlorine ion was detected. The product was dried at 50° C. The yield of the polymer (resist material) was 2.0 g, and the epoxy value of the polymer was 2.0 millimols/100 g.

The polymer was dissolved in dioxane. The solution was spinner coated on a chrome mask with metallic chromium vacuum-deposited on the substrate, and pre-baked at 60° C. for 30 minutes to form a thin film having a thickness of 2,700 Å on the metallic chromium layer.

The thin film was exposed to electron beams at an acceleration voltage of 27 KV in a vacuum, developed in ethyl acetate at 35° C. for 30 seconds, and rinsed with n-butyl acetate. The sensitivity and contrast of the resulting resist material and those of the starting material polyglycidyl methacrylate were as follows:

|  | $D_g{}^i$ (coul/cm$^2$) | $D_g{}^{0.5}$ (coul/cm$^2$) | $\gamma$ |
|---|---|---|---|
| Resist Material of Example 14 | $4.2 \times 10^{-7}$ | $7.0 \times 10^{-7}$ | 2.2 |
| Reference Material (starting PGMA) | $3.0 \times 10^{-6}$ | $6.0 \times 10^{-6}$ | 1.7 |

The resist material showed the same resolving power and stability as the resist material of Example 13.

EXAMPLE 15

2.8 g of polyglycidyl methacrylate as described in Example 13, 0.1 g of p-methoxyphenol as a thermal polymerization inhibitor and 2.0 g of methacrylic acid were dissolved in 50 cc of dioxane, and 0.5 cc of triethylamine was added as a catalyst. The mixture was maintained at 101° to 102° C. and stirred for 2 hours. The mixture was allowed to cool, and then a dimethylformamide solution of hydrochloric acid (3 cc of 35% hydrochloric acid and 30 cc of dimethylformamide) was added thereto. The mixture was stirred at 30° to 35° C. and one hour later the reaction mixture was poured into 1 liter of water. The polymer precipitaed was recovered, and, while being pulverized by a mixer, was washed with water until no chlorine ion was detected. The polymer was dried at 30° C. under reduced pressure to obtain 1.6 g of a resist material having an epoxy value of 0.0 millimol/100 g.

The resist material was dissolved in dioxane, and the solution was coated with a spinner on a silicon wafer whose surface was covered with a silicon oxide layer. The polymer coating was pre-baked at 60° C. for 15 minutes to form a sample with a thin film having a thickness of 2,700 Å on the oxide coating.

The thin film was exposed to electron beams in a vacuum at an acceleration voltage of 27 KV, developed in methyl Cellosolve acetate at 35° C. for 30 seconds, and then rinsed with n-butyl acetate. The sensitivity and contrast of this resist material and those of the starting material polyglycidyl methacrylate were as follows:

|  | $D_g{}^i$ (coul/cm$^2$) | $D_g{}^{0.5}$ (coul/cm$^2$) | $\gamma$ |
|---|---|---|---|
| Resist Material of Example 15 | $2.7 \times 10^{-7}$ | $7 \times 10^{-7}$ | 1.2 |
| Reference Material (starting PGMA) | $3.0 \times 10^{-6}$ | $6.0 \times 10^{-6}$ | 1.7 |

EXAMPLE 16

Poly(glycidyl p-vinyl benzoate) of the following formula:

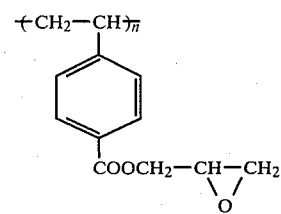

was prepared by the method described in Y. Iwakura et al., *Bull. Chem. Soc. Japan*, 41, 186-191 (1968). The polymer had a viscosity $[\eta]$ of 1.00 (30° C., dimethylformamide solution) indicating the degree of polymerization n and an epoxy value of 420 millimols/100 g.

2.0 g of this polymer and 2.6 g of monomethyl maleate were dissolved in 50 cc of dioxane, and 0.5 cc of triethylamine was added as a catalyst. The mixture was maintained at 101° to 102° C., and stirred for 2 hours. The mixture was allowed to cool to room temperature, and then a dimethylformamide solution of hydrochloric acid (3 cc of 35% hydrochloric acid and 30 cc of dimethylformamide) was added. The mixture was stirred at 30° to 35° C.

One hour later, the reaction mixture was poured into 1 liter of water. The polymer that precipitated was separated and recovered, and, while being pulverized by a mixer, was washed with water until no chlorine ion was detected. The product was dried under reduced pressure at 50° C. The yield of the polymer was 2.1 g, and the epoxy value of the polymer was 3.2 millimols/100 g.

The polymer (resist material) was dissolved in methyl Cellosolve acetate and the solution was coated with a spinner on a silicon wafer whose surface was covered with a silicon oxide layer. The polymer coating was pre-baked at 80° C. for 30 minutes to form a thin film having a thickness of 5,000 Å on the oxide coating. The thin film was exposed to electron beams in a vacuum at an acceleration voltage of 27 KV, developed with methyl Cellosolve acetate at 35° C., and rinsed with isoamyl acetate. The sensitivity and contrast of the resist material and that of the starting polyglycidyl p-vinylbenzoate were as follows:

|  | $D_g{}^i$ (coul/cm$^2$) | $D_g{}^{0.5}$ (coul/cm$^2$) | $\gamma$ |
|---|---|---|---|
| Resist Material in Example 16 | $2.0 \times 10^{-7}$ | $7.0 \times 10^{-7}$ | 1.7 |
| Reference Material (starting polyglycidyl p-vinylbenzoate) | $9.0 \times 10^{-7}$ | $2.5 \times 10^{-6}$ | .17 |

A resist pattern having a line-and-space of a width of 5,000 Å could be easily obtained by using this resist material. In other words, the electron beam was so scanned as to produce parallel lines of the resist having a linewidth of 5,000 Å, which were separated from each other by 5,000 Å. The stability of the resist material obtained in this Example was comparable to that of the resist material obtained in Example 13.

EXAMPLE 17

2.8 g of polyglycidyl methacrylate as described in Example 13 and 2.6 g of monomethyl fumarate were dissolved in 50 cc of dioxane, and 0.5 cc of triethylamine was added as a catalyst. The mixture was maintained at 101° to 102° C. and stirred for 2 hours.

The mixture was allowed to cool to room temperature, and 20 cc of a 10% nitric acid aqueous solution was added thereto. Three hours later, the reaction mixture was poured into 1 liter of water. The polymer that precipitated was separated and recovered, and, while being pulverized by a mixer, was thoroughly washed with water. The product was then carefully dried under reduced pressure. The yield of the polymer was 2.6 g, and the epoxy equivalent of the polymer was 0.0 millimol/100 g.

The polymer (resist material) was dissolved in methyl Cellosolve. The solution was coated with a spinner on a silicon wafer whose surface was covered with a silicon oxide layer. The polymer coating was pre-baked at 70° C. for 60 minutes to form a thin polymeric film having a thickness of 5,000 Å on the oxide coating.

The thin film was exposed to electron beams in a vacuum at an acceleration voltage of 27 KV, developed in methyl Cellosolve at 35° C. for 30 seconds, and then rinsed with dichloroethane.

The sensitivity and contrast of the resist material and those of the starting polyglycidyl methacrylate were as follows:

|  | $D_g^i$ (coul/cm$^2$) | $D_g^{0.5}$ (coul/cm$^2$) | $\gamma$ |
|---|---|---|---|
| Resist Material of Example 17 | $1.0 \times 10^{-7}$ | $1.8 \times 10^{-7}$ | 1.9 |
| Reference Material (starting PGMA) | $3.0 \times 10^{-6}$ | $6.0 \times 10^{-6}$ | 1.7 |

The resist material exhibited the same resolving power and stability as the resist material of Example 13.

EXAMPLE 18

The resist material obtained in Example 13 was rotatingly coated on a glass substrate having a chromium vacuum-deposited layer thereon. The resist material coating was pre-baked at 80° C. for 30 minutes to form a thin polymeric film having a thickness of 5,000 Å on the chromium vacuum-deposited layer. The thin film was exposed to soft X-rays (Mo L 5.4 Å). The irradiation energy was measured using a gas flow-type proportional counter. The resolving power of the resist material was determined by using a silicon membrane mask with a gold pattern of 8,000 Å thereon, and maintaining the space between the mask and the thin polymeric film at 15,000 Å.

After the irradiation with X-rays, the substrate was developed by immersion in methyl Cellosolve acetate at 35° C. for 30 seconds, and then rinsed with n-butyl acetate.

The amount of irradiation ($D_g^{0.5}$) required for 50% (2,500 Å) of the coated film thickness to remain after the development was 40 mJ/cm$^2$, and the gold pattern of 8,000 Å could be faithfully reproduced.

While the invention has been described in detail and with reference to specific embodiments thereof, it will be apparent to one skilled in the art that various changes and modifications can be made therein without departing from the spirit and scope thereof.

What is claimed is:

1. A resist material curable by irradiation with high energy radiation but substantially non-curable by irradiation with light having a wavelength of about 300 nm or more, the resist material comprising, as a main component, a solvent-soluble polymer containing ethylenically unsaturated double bonds, the polymer being obtained by reacting (a) a polymer having a plurality of oxirane rings therein and (b) a monomer containing (i) at least one ethylenically unsaturated double bond and (ii) one functional group capable of opening the oxirane rings, and then opening unreacted oxirane rings with an oxirane ring-opening agent selected from the group consisting of a hydrogen halide, hydrogen sulfide and hydrogen cyanide.

2. The resist material of claim 1, wherein the polymer having a plurality of oxirane rings is a homopolymer of a monomer containing an ethylenically unsaturated double bond and an oxirane ring, a copolymer of two or more monomers containing an ethylenically unsaturated double bond and an oxirane ring, or a copolymer of at least one monomer containing an ethylenically unsaturated double bond and an oxirane ring with at least one other monomer containing an ethylenically unsaturated double bond and free of oxirane rings and free of a substituent group reactive with oxirane rings.

3. The resist material of claim 1 or 2, wherein said polymer containing a plurality of oxirane rings is a polymer of monomer units in which at least 10 mol% of the monomer units are monomer units containing an oxirane ring.

4. The resist material of claim 1, wherein the polymer having a plurality of oxirane rings is a homopolymer of a monomer containing an ethylenically unsaturated double bond and an oxirane ring or a copolymer of two or more monomers containing an ethylenically unsaturated double bond and an oxirane ring.

5. The resist material of claim 1, wherein the polymer having a plurality of oxirane rings is a copolymer of at least one monomer containing an ethylenically unsaturated double bond and an oxirane ring with at least one other monomer containing an ethylenically unsaturated double bond and free of oxirane rings and free of a substituent group reactive with oxirane rings.

6. The resist material of claim 2, wherein said monomer containing an ethylenically unsaturated double bond and an oxirane ring is glycidyl acrylate, glycidyl methacrylate, 2-vinylthioglycidyl ether, allyl glycidyl ether, glycidyl vinylacetate, glycidyl allylacetate, 4-glycidyl styrene, 2-allylphenyl glycidyl ether, 4-allylphenyl glycidyl ether, glycidyl 4-vinylbenzoate, 3,4-epoxybutene, 3,4-epoxy-2-methylbutene, 4-vinylcyclohexene oxide or p-divinylstyrene monooxide.

7. The resist material of claim 2, wherein said at least one other monomer containing an ethylenically unsaturated double bond and free from an oxirane ring and a substituent group reactive with oxirane rings is a vinyl monomer, an alkylacrylate or methacrylate, a cycloalkylacrylate or methacrylate, an arylacrylate or methacrylate, an aralkylacrylate or methacrylate, an acrylic or methacrylic acid derivative, a vinyl halide, a vinyl ketone, vinyl acetic acid or allyl acetic acid.

8. The resist material of claim 1, wherein said polymer having a plurality of oxirane rings has a number average molecular weight of about $10^2$ to $10^6$.

9. The resist material of claim 1, wherein said monomer containing at least one ethylenically unsaturated double bond and one functional group capable of opening oxirane rings is a monomer containing a carboxyl group, an acyl halide group, a hydroxyl group, a thiol group or a secondary amino group.

10. The resist material of claim 9, wherein said monomer containing a carboxyl group is an unsaturated aliphatic monocarboxylic acid or dicarboxylic acid monoester.

11. The resist material of claim 10, wherein said unsaturated aliphatic monocarboxylic acid or dicarboxylic acid monoester is a monoester of maleic acid, a monoester of fumaric acid, a monoester of itaconic acid, acrylic acid, methacrylic acid, a monoester of cis-4-cyclohexene-1,2-dicarboxylic acid, a monoester of 5-norbornene-2,2-dicarboxylic acid, or a monoester of hexachloro[2,2,1]-bicyclohept-5-ene-2,3-dicarboxylic acid.

12. The resist material of claim 9, wherein said monomer containing an acyl halide group is acryloyl chloride, methacryloyl chloride, methylvinylacetyl chloride, 3-allylpropionyl chloride, allylphenylacetyl chloride, allylbenzylacetyl chloride, monomethylmaleoyl chloride, monoethylmaleoyl chloride, monoisopropylmaleoyl chloride, monomethylfumaroyl chloride, monoethylfumaroyl chloride, monoisopropylfumaroyl chloride, monomethylitaconoyl chloride or the corresponding acid bromides to these acid chlorides.

13. The resist material of claim 9, wherein said monomer containing a hydroxyl group is a monomer containing an alcoholic hydroxyl group or a monomer containing a phenolic hydroxyl group.

14. The resist material of claim 13, wherein said monomer containing a hydroxyl group is allyl alcohol, ethylene glycol monoacrylate, ethylene glycol monomethacrylate, diethylene glycol monoacrylate, diethylene glycol monomethacrylate, trimethylolpropane diacrylate, trimethylolpropane dimethacrylate, pentaerythritol triacrylate, pentaerythritol trimethacrylate, 2-hydroxyethyl acrylate, 2-hydroxyethyl methacrylate, 2-hydroxypropyl acrylate, 2-hydroxypropyl methacrylate, 4-vinylbenzyl alcohol, 4-allylbenzyl alcohol, 4-hydroxystyrene, 2-hydroxystyrene, 3-hydroxystyrene, 2-allyl phenol, 2-methyl-6-allyl phenol, 2-allyl-4-methylphenol, 1-allyl-2-naphthol, eugenol, 4-allyl anisole, 3-allyl anisole, 2,6-diallyl phenol, 2,6-diallyl p-cresol or 2,4,5-triallyl phenol.

15. The resist material of claim 9, wherein said monomer containing a thiol group is allyl mercaptan, mercapto-butene-2, mercaptobutene-3, mercaptopentene-4, mercaptopentene-1, 2-vinylthiophenol or 2-allylthiophenol.

16. The resist material of claim 9, wherein said monomer containing a secondary amino group is N-methylallylamine, diallylamine, N-methylaminoethyl acrylate, N-methylaminoethyl methacrylate, N-propylaminomethyl acrylate, N-propylaminomethyl methacrylate, N-propylaminoethyl acrylate, N-propylaminoethyl methacrylate, N-benzylallylamine, N-allyl aniline, or N-allyl-2-toluidine.

17. A method of forming a resist comprising irradiating an element comprising a substrate having thereon a thin film of the resist material of claim 1, with high energy radiation, and removing the unexposed, uncured portions of the resist film by dissolving the uncured portions in a solvent, thereby forming a pattern of the cured, exposed portions of the resist material film on the surface of the substrate.

18. The method of forming a resist of claim 17, wherein the polymer having a plurality of oxirane rings is a homopolymer of a monomer containing an ethylenically unsaturated double bond and an oxirane ring, a copolymer of two or more monomers containing an ethylenically unsaturated double bond and an oxirane ring, or a copolymer of at least one monomer containing an ethylenically unsaturated double bond and an oxirane ring with at least one other monomer containing an ethylenically unsaturated double bond and free of oxirane rings and free of a substituent group reactive with oxirane rings.

19. The method of forming a resist of claim 17 or 18, wherein said polymer containing a plurality of oxirane rings is a polymer of monomer units in which at least 10 mol% of the monomer units are monomer units containing an oxirane ring.

20. The method of forming a resist of claim 17, wherein the polymer having a plurality of oxirane rings is a homopolymer of a monomer containing an ethylenically unsaturated double bond and an oxirane ring or a copolymer of two or more monomers containing an ethylenically unsaturated double bond and an oxirane ring.

21. The method of forming a resist of claim 17, wherein the polymer having a plurality of oxirane rings is a copolymer of at least one monomer containing an ethylenically unsaturated double bond and an oxirane ring with at least one other monomer containing an ethylenically unsaturated double bond and free of oxirane rings and free of a substituent group reactive with oxirane rings.

22. The method of forming a resist of claim 18, wherein said monomer containing an ethylenically unsaturated double bond and an oxirane ring is glycidyl acrylate, glycidyl methacrylate, 2-vinylthioglycidyl ether, allyl glycidyl ether, glycidyl vinylacetate, glycidyl allylacetate, 4-glycidyl styrene, 2-allylphenyl glycidyl ether, 4-allylphenyl glycidyl ether, glycidyl 4-vinylbenzoate, 3,4-epoxybutene, 3,4-epoxy-2-methylbutene, 4-vinylcyclohexene oxide or p-divinylstyrene monooxide.

23. The method of forming a resist of claim 18, wherein said at least one other monomer containing an ethylenically unsaturated double bond and free from an oxirane ring and a substituent group reactive with oxirane rings is a vinyl monomer, an alkylacrylate or methacrylate, a cycloalkylacrylate or methacrylate, an arylacrylate or methacrylate, an aralkylacrylate or methacrylate, an acrylic or methacrylic acid derivative, a vinyl halide, a vinyl ketone, vinyl acetic acid or allyl acetic acid.

24. The method of forming a resist of claim 17, wherein said polymer having a plurality of oxirane rings has a number average molecular weight of about $10^2$ to $10^6$.

25. The method of forming a resist of claim 17, wherein said monomer containing at least one ethylenically unsaturated double bond and one functional group capable of opening oxirane rings is a monomer containing a carboxyl group, an acyl halide group, a hydroxyl group, a thiol group or a secondary amino group.

26. The method of forming a resist of claim 25, wherein said monomer containing a carboxyl group is an unsaturated aliphatic monocarboxylic acid or dicarboxylic acid monoester.

27. The method of forming a resist of claim 26, wherein said unsaturated aliphatic monocarboxylic acid or dicarboxylic acid monoester is a monoester of maleic acid, a monoester of fumaric acid, a monoester of itaconic acid, acrylic acid, methacrylic acid, a monoester of cis-4-cyclohexene-1,2-dicarboxylic acid, a monoester of 5-norbornene-2,2-dicarboxylic acid, or a monoester of hexachloro-[2,2,1]-bicyclohept-5-ene-2,3-dicarboxylic acid.

28. The method of forming a resist of claim 25, wherein said monomer containing an acyl halide group is acryloyl chloride, methacryloyl chloride, methylvinylacetyl chloride, 3allylpropionyl chloride, allylphenylacetyl chloride, allylbenzylacetyl chloride, monomethylmaleoyl chloride, monoethylmaleoyl chloride, monoisopropylmaleoyl chloride, monomethylfumaroyl chloride, monoethylfumaroyl chloride, monoisopropylfumaroyl chloride, monomethylitaconoyl chloride or the corresponding acid bromides to these acid chlorides.

29. The method of forming a resist of claim 25, wherein said monomer containing a hydroxyl group is a monomer containing an alcoholic hydroxyl group or a monomer containing a phenolic hydroxyl group.

30. The method of forming a resist of claim 29, wherein said monomer containing a hydroxyl group is allyl alcohol, ethylene glycol monoacrylate, ethylene glycol monomethacrylate, diethylene glycol monoacrylate, diethylene glycol monomethacrylate, trimethylolpropane diacrylate, trimethylolpropane dimethacrylate, pentaerythritol triacrylate, pentaerythritol trimethacrylate, 2-hydroxyethyl acrylate, 2-hydroxyethyl methacrylate, 2-hydroxypropyl acrylate, 2-hydroxypropyl methacrylate, 4-vinylbenzyl alcohol, 4-allylbenzyl alcohol, 4-hydroxystyrene, 2-hydroxystyrene, 3-hydroxystyrene, 2-allyl phenol, 2-methyl-6-allyl phenol, 2-allyl-4-methylphenol, 1-allyl-2-naphthol, eugenol, 4-allyl anisole, 3-allyl anisole, 2,6-diallyl phenol, 2,6-diallyl p-cresol or 2,4,5-triallyl phenol.

31. The method of forming a resist of claim 25, wherein said monomer containing a thiol group is allyl mercaptan, mercaptobutene-2, mercaptobutene-3, mercaptopentene-4, mercaptopentene-1, 2-vinylthiophenol, or 2-allylthiophenol.

32. The method of forming a resist of claim 25, wherein said monomer containing a secondary amino group is N-methylallylamine, diallylamine, N-methylaminoethyl acrylate, N-methylaminoethyl methacrylate, N-propylaminomethyl acrylate, N-propylaminomethyl methacrylate, N-propylaminoethyl acrylate, N-propylaminoethyl methacrylate, N-benzylallylamine, N-allyl aniline, or N-allyl-2-toluidine.

* * * * *